US011281405B2

(12) United States Patent
Sharma et al.

(10) Patent No.: US 11,281,405 B2
(45) Date of Patent: Mar. 22, 2022

(54) CONTROLLED DIE ASYMMETRY DURING MLC OPERATIONS FOR OPTIMAL SYSTEM PIPELINE

(71) Applicant: WESTERN DIGITAL TECHNOLOGIES, INC., San Jose, CA (US)

(72) Inventors: Amit Sharma, Karnataka (IN); Abhinandan Venugopal, Karnataka (IN); Dinesh Kumar Agarwal, Karnataka (IN)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/896,029

(22) Filed: Jun. 8, 2020

(65) Prior Publication Data

US 2021/0382652 A1 Dec. 9, 2021

(51) Int. Cl.
*G11C 11/56* (2006.01)
*G06F 3/06* (2006.01)
*G11C 16/04* (2006.01)
*G11C 16/10* (2006.01)
*G11C 16/26* (2006.01)

(52) U.S. Cl.
CPC .......... *G06F 3/0659* (2013.01); *G06F 3/0613* (2013.01); *G06F 3/0679* (2013.01); *G11C 11/5628* (2013.01); *G11C 11/5671* (2013.01); *G11C 16/0483* (2013.01); *G11C 16/10* (2013.01); *G11C 16/26* (2013.01); *G11C 2211/5641* (2013.01)

(58) Field of Classification Search
None
See application file for complete search history.

(56) References Cited

U.S. PATENT DOCUMENTS 9,153,324 B2  10/2015  Parker et al.
9,245,590 B2   1/2016  Chen et al.
9,329,986 B2   5/2016  Li et al.
(Continued)

FOREIGN PATENT DOCUMENTS

EP  3176688 A1  6/2017

*Primary Examiner* — Douglas King
(74) *Attorney, Agent, or Firm* — Arent Fox LLP

(57) ABSTRACT

Aspects of a storage device including a plurality of dies and a controller are provided which allow for asymmetric die operation handling so that controller overheads associated with common resource intensive operations may be incurred in the background without delaying subsequent die operations. When the controller receives a command to perform an MLC operation such as programming a number of dies, the controller refrains from performing the MLC operation in one or more of the dies for a period of time while simultaneously performing the MLC operation in a remainder of the dies. Instead, the controller performs another operation, such as an SLC operation, another MLC operation, or a transfer operation, that involves a common resource in these dies during the period of time. Controller overheads associated with these other operations thus are incurred without creating bottlenecks when the number of dies is large, thereby improving storage device performance.

19 Claims, 12 Drawing Sheets

(56) References Cited

U.S. PATENT DOCUMENTS

| | | | |
|---|---|---|---|
| 2008/0209109 A1* | 8/2008 | Lasser | G06F 12/0804 |
| | | | 711/103 |
| 2009/0244949 A1* | 10/2009 | Ravasio | G06F 13/385 |
| | | | 365/63 |
| 2017/0123666 A1 | 5/2017 | Sinclair et al. | |
| 2017/0357447 A1* | 12/2017 | Jung | G06F 3/0659 |
| 2018/0275922 A1 | 9/2018 | Nemazie | |

* cited by examiner

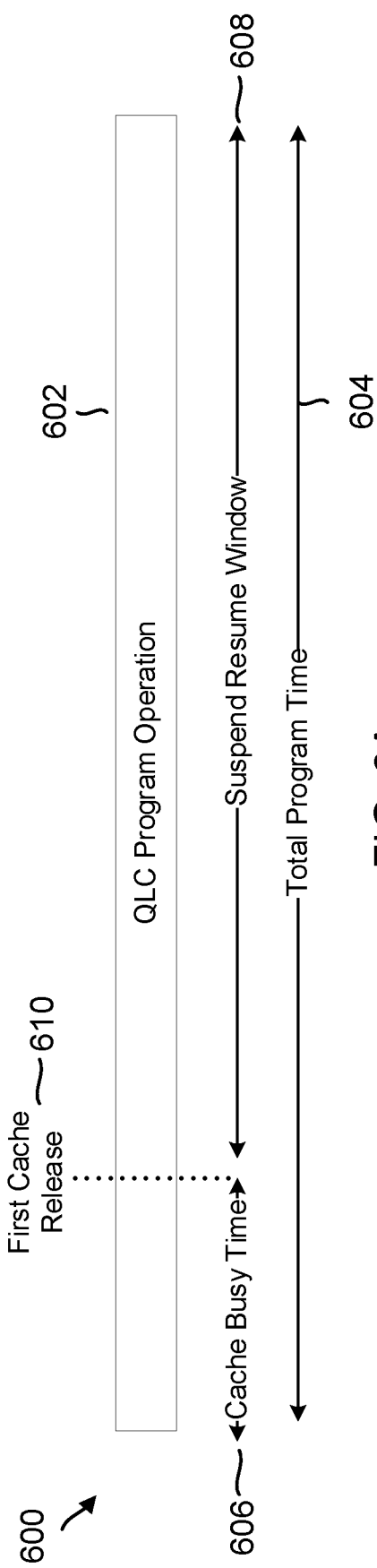

CONTROLLED DIE ASYMMETRY DURING MLC OPERATIONS FOR OPTIMAL SYSTEM PIPELINE

BACKGROUND

Field

This disclosure is generally related to electronic devices and more particularly to storage devices.

Background

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

A flash storage device may store control information associated with data. For example, a flash storage device may maintain control tables that include a mapping of logical addresses to physical addresses. This control tables are used to track the physical location of logical sectors, or blocks, in the flash memory. The control tables are stored in the non-volatile memory to enable access to the stored data after a power cycle.

When writing data to cells of the flash memory, the flash storage device may identify the physical address of a block associated with a logical address, transfer the data to a number of data latches, and then program the data from the latches to the cells of the block at the identified physical address. Similarly, when reading data from cells of the flash memory, the flash storage device may identify the physical address of the block, sense the stored data in the block at the identified address into the data latches, and then read the data from the latches into a controller of the flash storage device. Including more dies containing these blocks in various types of NAND storage devices (e.g. SSDs, micro SD cards, Universal Serial Bus (USB) drives) may increase the storage capacity of such devices. Moreover, reducing the number of data latches in flash storage devices may save the costs of designing such devices.

Moreover, the flash storage device may suspend and resume program operations (i.e. to perform other operations such as sense operations) within a given time window. During this window, the firmware or controller overhead of the flash storage device for performing operations (e.g. the time used by the controller to prepare and send an operation command to a die) may be incurred in the background while operations themselves are being performed in the foreground. Such hiding of controller overheads (in the background) may reduce latency in completing the operations and improve the performance of the flash storage device. However, as the number of data latches is reduced to save cost, the length of the suspend resume window may be similarly reduced, thus resulting in less opportunity to hide controller overheads behind other operations. This effect on performance may become more significant as the number of dies in the flash storage device increases to improve storage capacity, thereby increasing the amount of controller overhead that may be incurred.

SUMMARY

One aspect of a storage device is disclosed herein. The storage device includes a plurality of dies and a controller. The plurality of dies each include a plurality of multi-level cells (MLCs) and a plurality of single-level cells (SLCs). The controller is configured to receive an MLC program command, to refrain from programming data in the MLCs of one of the dies for a period of time while simultaneously programming one or more of the MLCs in each of a remainder of the dies, and to perform an SLC operation in the one of the dies during the period of time.

Another aspect of a storage device is disclosed herein. The storage device includes a plurality of dies and a controller. The plurality of dies each include a plurality of MLCs and a plurality of SLCs. The controller is configured to refrain from performing a first MLC operation in one of the dies for a period of time while simultaneously performing the first MLC operation in one or more of the MLCs in each of a remainder of the dies, and to perform one of an SLC operation, a second MLC operation different than the first MLC operation, or a transfer operation in the one of the dies during the period of time.

A further aspect of a storage device is disclosed herein. The storage device includes a plurality of dies and a controller. The plurality of dies each include a plurality of MLCs and a plurality of SLCs. The controller is configured to receive an MLC program command, to refrain from programming data in the MLCs of a number of the dies for a period of time while simultaneously programming one or more of the MLCs in each of a remainder of the dies, and to perform one of an SLC operation, a different MLC operation, or a transfer operation in the number of the dies during the period of time.

It is understood that other aspects of the storage device will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein:

FIGS. 6A and 6B are conceptual diagrams illustrating examples of suspend resume windows in a quad-level cell (QLC) program operation with different sizes in the storage device of FIG. 1.

DETAILED DESCRIPTION

Figure 1:
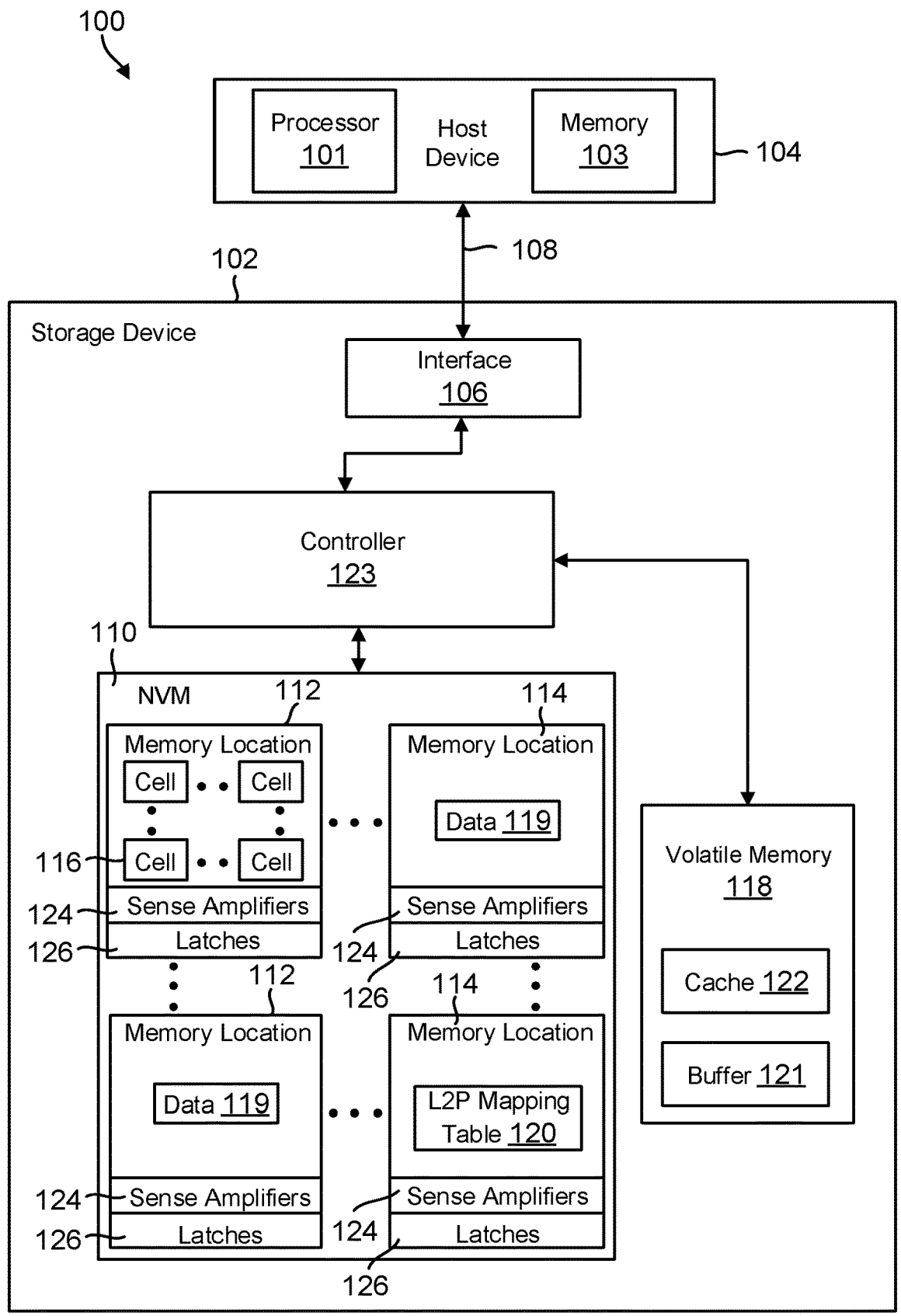
FIG. 1 is a block diagram illustrating an exemplary embodiment of a storage device in communication with a host device.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

As used herein, the term "coupled" is used to indicate either a direct connection between two components or, where appropriate, an indirect connection to one another through intervening or intermediate components. In contrast, when a component referred to as being "directly coupled" to another component, there are no intervening elements present.

In the following detailed description, various aspects of a storage device in communication with a host device will be presented. These aspects are well suited for flash storage devices, such as SSDs and SD cards. However, those skilled in the art will realize that these aspects may be extended to all types of storage devices capable of storing data. Accordingly, any reference to a specific apparatus or method is intended only to illustrate the various aspects of the present invention, with the understanding that such aspects may have a wide range of applications without departing from the spirit and scope of the present disclosure.

When a controller of the storage device writes data into cells of memory during a program operation, the controller may suspend the program operation, perform another operation such as reading data from the cells of the memory, and then resume the suspended program operation. When operating within a suspend resume window, the controller may incur overheads by serially creating and sending operation commands to the dies to be handled in parallel. However, as the number of data latches in the storage device is reduced to save cost, the size of the suspend resume window may shrink. Therefore, the firmware overheads incurred by the controller may be too long to hide within the small suspend resume window, impacting performance of the storage device.

In attempt to maximize performance of parallel die operations, one approach may be to hide the controller overhead for subsequent NAND operations behind current NAND operations, regardless of (e.g. outside of) suspend resume windows. For example, while the storage device in the foreground is handling one page of data across multiple dies, the controller in the background may serially create context information and send operation commands to the dies to handle a subsequent page of data in parallel. Such approach may be effective in reducing latency for a small number of dies. However, as the number of dies in the storage device is increased to improve storage capacity, the controller overheads may similarly increase (e.g. lengthen in amount of time). Although the larger number of controller overheads may still be hidden behind longer or slower operations (e.g. program operations), such overheads may not be successfully hidden behind shorter or faster operations (e.g. sense operations). For example, the time for the controller to serially create and send instructions in the background to the larger number of dies to read a subsequent page, may be longer than the time for the dies in the foreground to complete a read operation of a current page. As a result, some controller overheads that have not been processed in the background may remain after the read operation is completed and therefore may be processed in the foreground, thereby causing a bottleneck that delays the time to read the subsequent page and that reduces the performance of the storage device.

Figure 8:
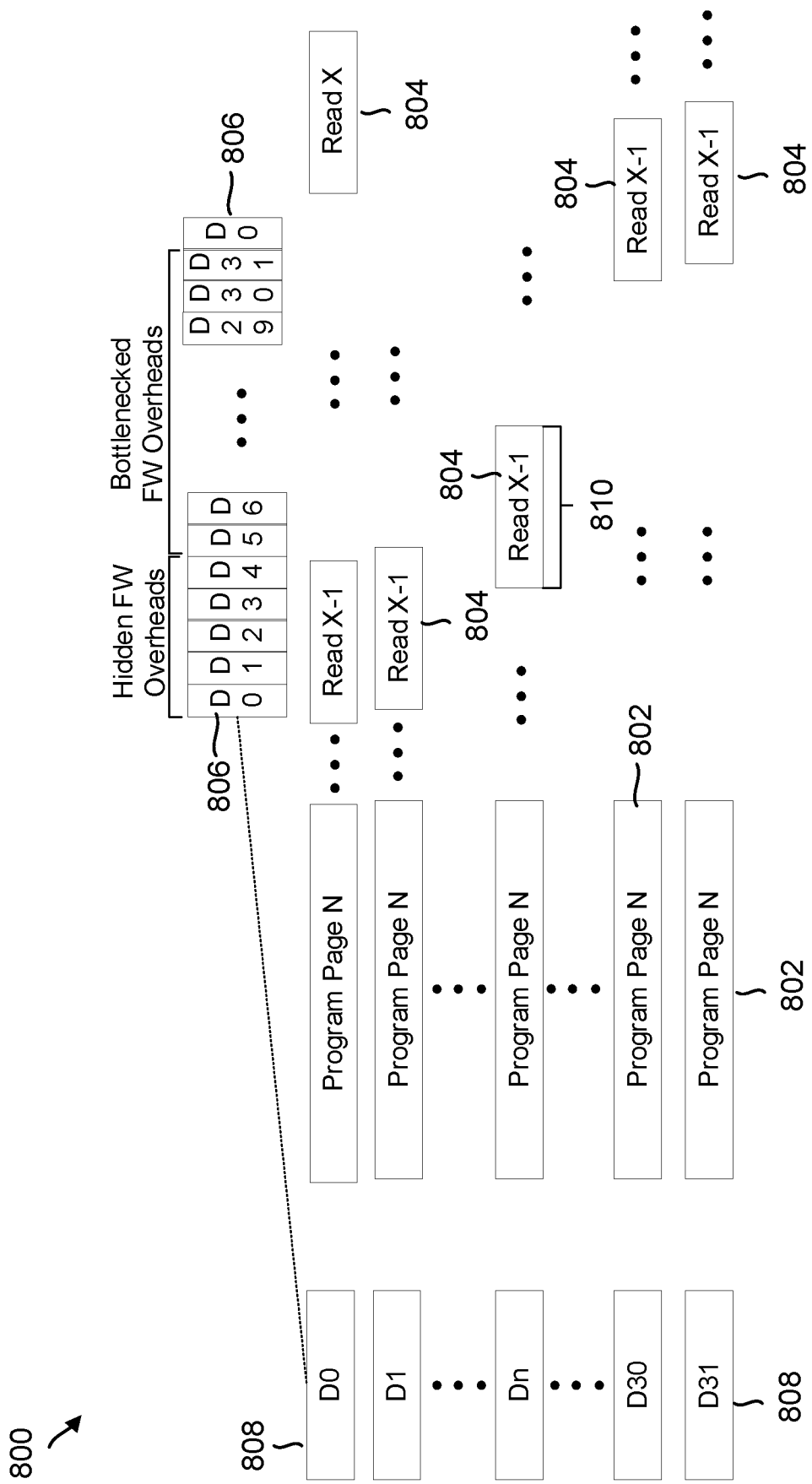
FIG. 8 is a conceptual diagram illustrating an example of program and read operations performed for a large number of dies.
Figure 9:
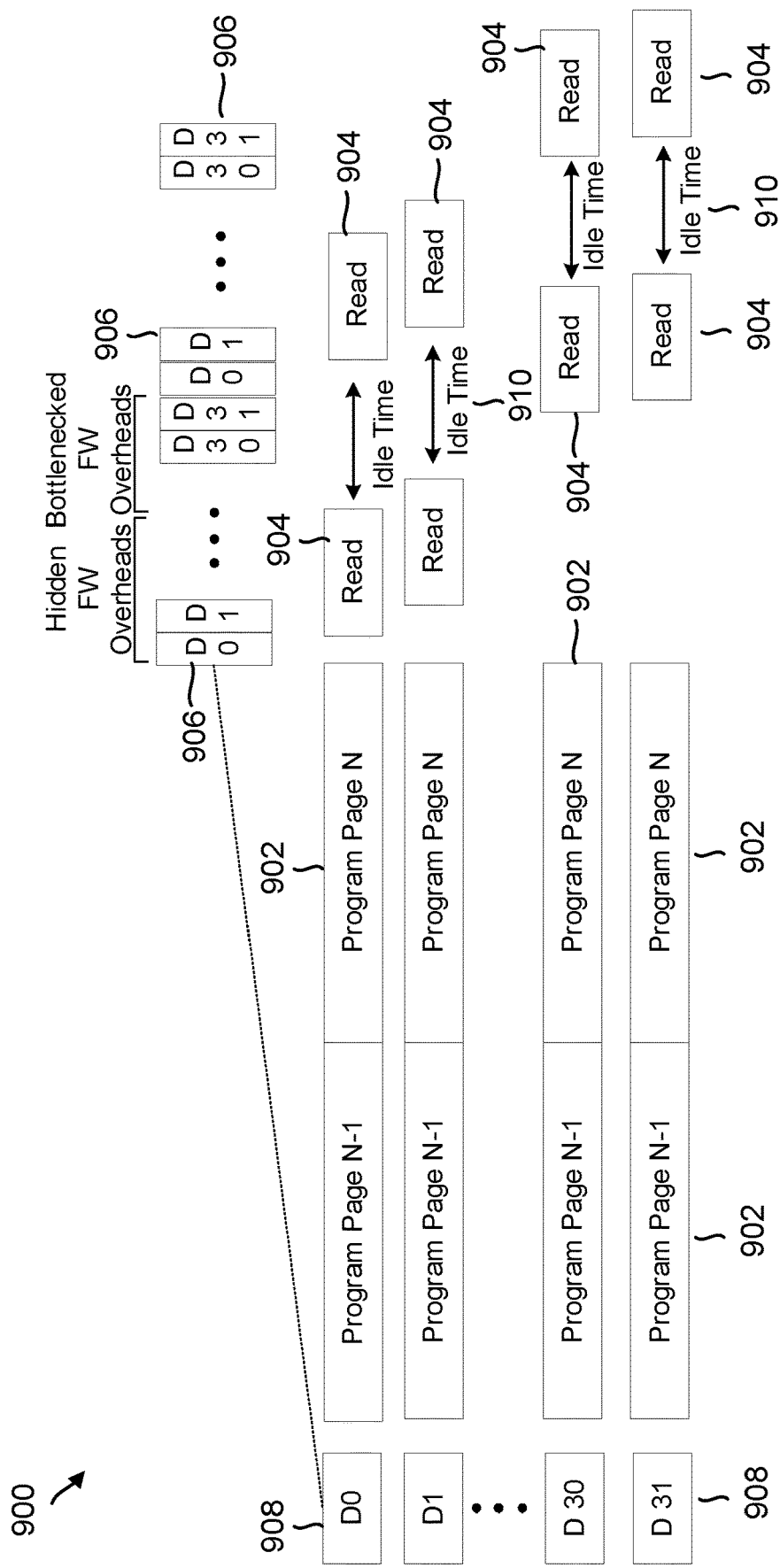
FIG. 9 is a conceptual diagram illustrating another example of program and read operations performed for a large number of dies.
Figure 10:
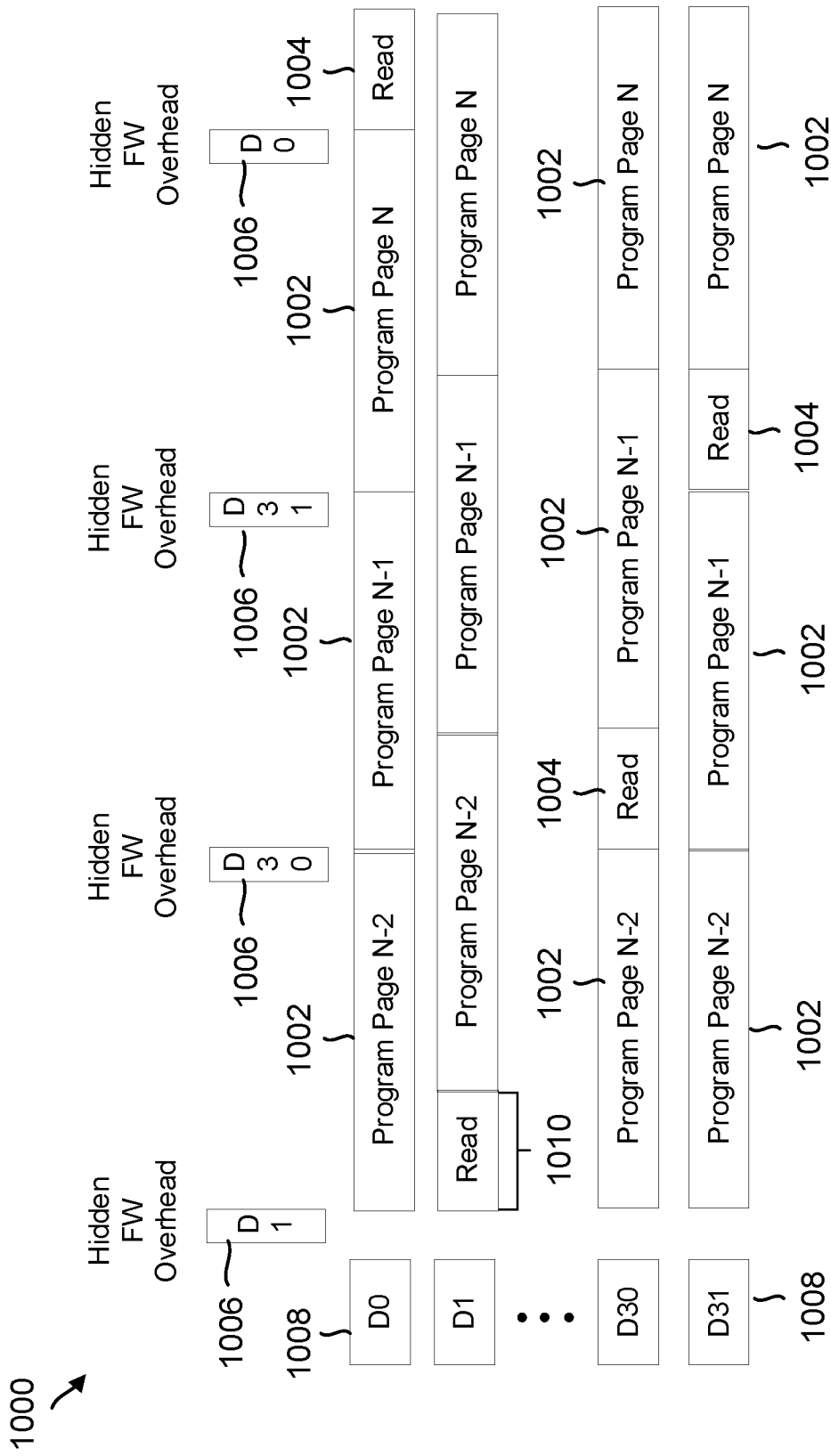
FIG. 10 is a conceptual diagram illustrating an example of program and read operations asymmetrically performed for a large number of dies.

To address such delays due to larger numbers of dies, the storage device described in the present disclosure performs different operations in one or more of the dies asymmetrically with respect to each other. For example, when the controller receives a command from a host device to perform a QLC program operation in multiple dies, then rather than waiting to complete the program operation for all of the pages in all of the dies prior to performing a SLC read or other central processing unit (CPU)-intensive operation (e.g. as illustrated in FIGS. 8 and 9), the controller may intentionally delay programming one or more of the dies and perform the CPU-intensive operation while the other dies are busy programming (e.g. as illustrated in FIG. 10). The controller may also select different die(s) to perform CPU-intensive operation(s) while other dies are busy programming at different times. For instance, in a storage device with 32 dies, the controller may perform a SLC read operation in a first die while the other 31 dies are programming a first page, the controller may next perform a SLC read operation in a second die while other dies are programming a second page, the controller may subsequently perform a SLC read operation in a third die while other dies are programming a third page, and so forth until the QLC program operation is complete.

While the above example refers specifically to CPU-intensive operations such as SLC read operations, the present disclosure may similarly be applied to operations involving other common resources such as controller random access memory (RAM) buffers and direct memory access (DMA) speeds. For instance, the controller may intentionally delay programming data in one or more of the dies in order to transfer that data to a buffer in RAM for data relocation while the other dies are busy programming. Moreover, the controller may intentionally delay programming one or more of the dies in order to receive or transmit data using DMA while the other dies are busy programming. By refraining from attempting to perform CPU-intensive or other common resource involving operations in all dies at the same time, the storage device may scatter the controller overheads associated with these operations such that they occur in the background during different die operations at different times, thereby reducing operation latency and improving storage device performance.

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

As shown in the exemplary embodiment of FIG. 1, the storage device 102 includes non-volatile memory (NVM) 110 for persistent storage of data received from the host 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the illustrated exemplary embodiment of FIG. 1, each memory location 112 may be a block 114 including multiple cells 116. The cells 116 may be single-level cells, multi-level cells, triple-level cells, quad-level cells, and/or penta-level cells, for example. Other examples of memory locations 112 are possible; for instance, each memory location may be a die containing multiple blocks. Moreover, each memory location may include one or more blocks in a 3-D NAND array. Moreover, the illustrated memory locations 112 may be logical blocks which are mapped to one or more physical blocks.

The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a buffer 121 (e.g. a write buffer or a read buffer) for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
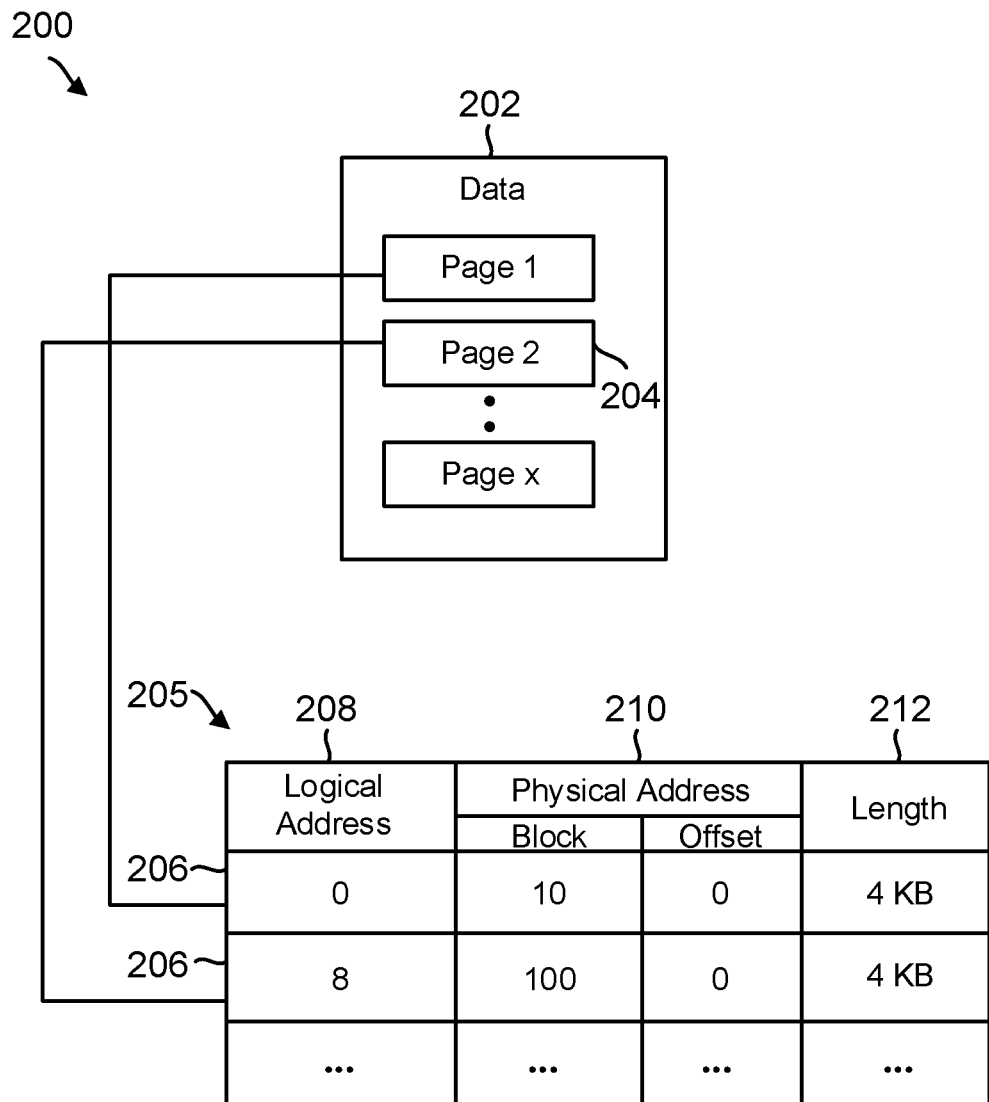
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 4 KB or some other size).

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

Figure 3:
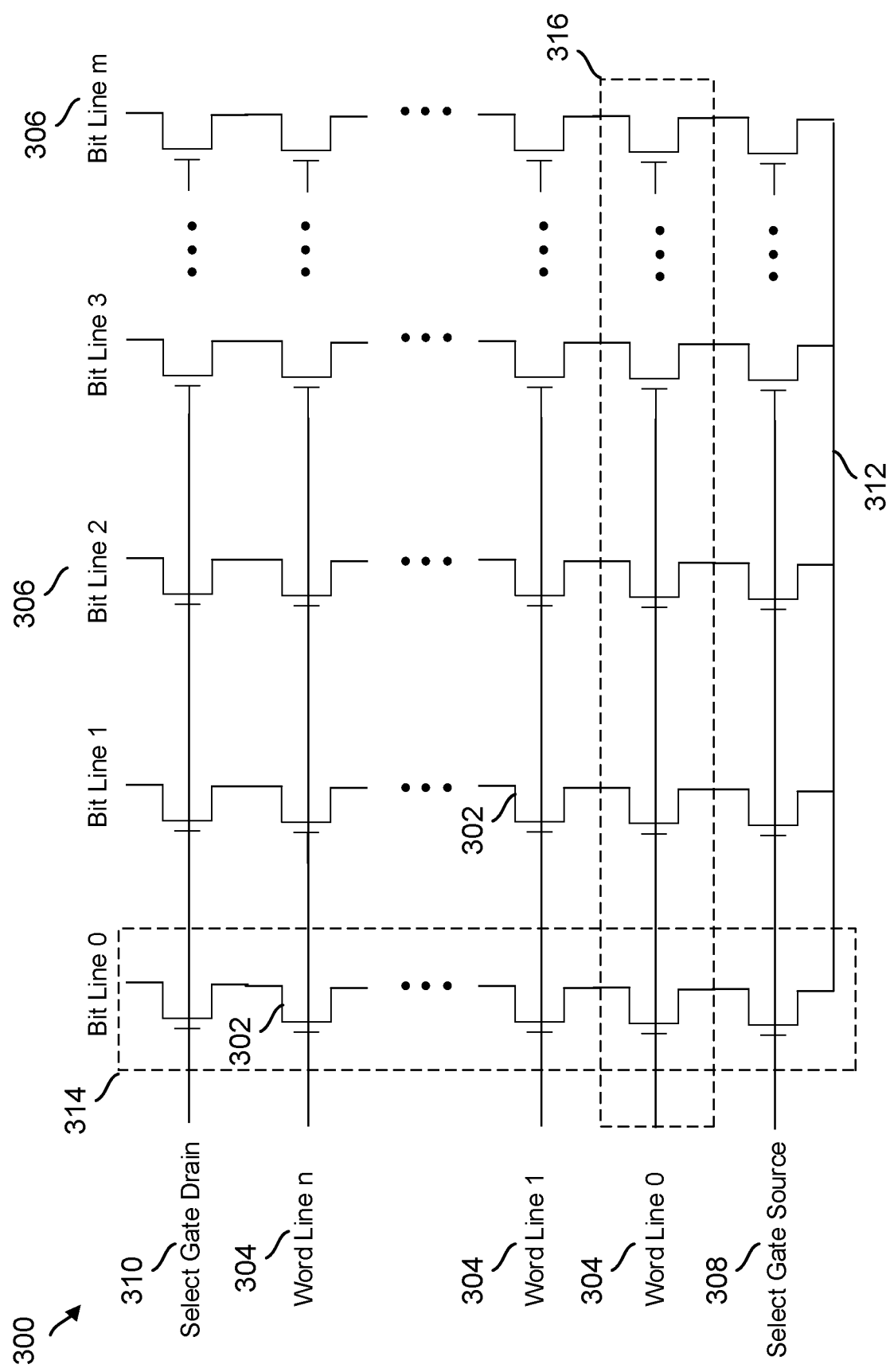
FIG. 3 is a conceptual diagram illustrating an example of an array of memory cells in the storage device of FIG. 1.

FIG. 3 illustrates an example of a NAND memory array 300 of cells 302. Cells 302 may correspond to cells 116 in the NVM 110 of FIG. 1. Multiple cells 302 are coupled to word lines 304 and bit lines 306. For example, the memory array 300 may include n word lines and m bit lines within a block 114 of the NVM 110, where n and m are predefined according to the size of the block. Each word line and bit line may be respectively associated with a row and column address, which the controller 123 may use to select particular word lines and bit lines (e.g. using a row and column decoder). For example, word lines 0-n may each be associated with their own row address (e.g. word line 0 may correspond to word line address 0, word line 1 may correspond to word line address 1, etc.), and bit lines 0-m may each be associated with their own column address (e.g. bit line 0 may correspond to bit line address 0, bit line 1 may correspond to bit line address 1, etc.). Select gate source (SGS) cells 308 and select gate drain (SGD) cells 310 are coupled to the memory cells 302 on each bit line 306. The SGS cells 308 and SGD cells 310 connect the memory cells 302 to a source line 312 (e.g. ground) and bit lines 306, respectively. A string 314 may include a group of cells 302 (including SGS and SGD cells 308, 310) coupled to one bit line within a block, while a page 316 may include a group of cells 302 coupled to one word line within the block.

Figure 4:
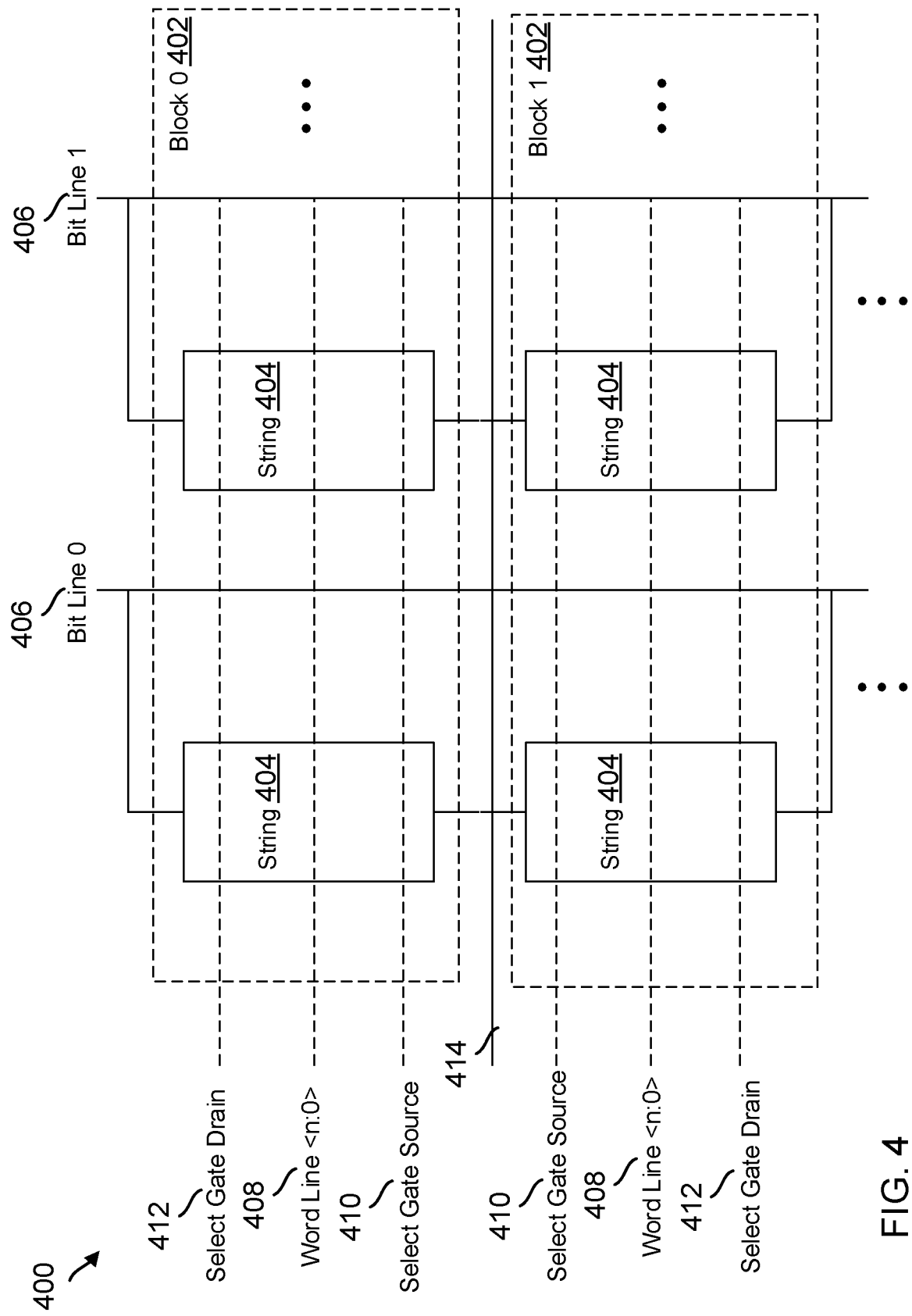
FIG. 4 is a conceptual diagram illustrating an example of an array of blocks in the storage device of FIG. 1.

FIG. 4 illustrates an example of a NAND memory array 400 of blocks 402 including multiple strings 404. Blocks 402 may correspond to blocks 114 in the NVM 110 of FIG. 1, and strings 404 may each correspond to string 314 in FIG. 3. As in the memory array 300 of FIG. 3, each string 404 may include a group of memory cells each coupled to a bit line 406 and individually coupled to respective word lines 408. Similarly, each string may include a SGS cell 410 and SGD cell 412 which respectively connects the memory cells in each string 404 to a source line 414 and bit line 406.

When the controller 123 reads data from or writes data to a page 316 of cells 302 (i.e. on a word line 304, 408), the controller may send a command to apply a read voltage or program voltage to the selected word line and a pass through voltage to the other word lines. The read or programmed state of the cell (e.g. a logic '0' or a logic '1' for SLCs) may then be determined based on a threshold voltage of the cells 302. For example, during an SLC read operation, if the threshold voltage of a cell 302 is smaller than the read voltage (i.e. current flows through the cell in response to the read voltage), the controller 123 may determine that the cell stores a logic '1', while if the threshold voltage of the cell 302 is larger than the read voltage (i.e. current does not flow through the cell in response the read voltage), the controller 123 may determine that the cell stores a logic '0'. Similarly, during an SLC program operation, the controller may store a logic '0' by sending a command to apply the program voltage to the cell 302 on the word line 304, 408 until the cell reaches the threshold voltage, and during an erase operation, the controller may send a command to apply an erase voltage to the block 402 including the cells 302 (e.g. to a substrate of the cells such as a p-well) until the cells reduce back below the threshold voltage (back to logic '1').

For cells that store multiple bits (e.g. MLCs, TLCs, etc.), each word line 304, 408 may include multiple pages 316 of cells 302, and the controller may similarly send commands to apply read or program voltages to the word lines to determine the read or programmed state of the cells based on a threshold voltage of the cells. For instance, in the case of TLCs, each word line 304, 408 may include three pages 316, including a lower page (LP), a middle page (MP), and an upper page (UP), respectively corresponding to the different bits stored in the TLC. When programming TLCs, the LP may be programmed first, followed by the MP and then the UP. For example, a program voltage may be applied to the cell on the word line 304, 408 until the cell reaches a first intermediate threshold voltage corresponding to a least significant bit (LSB) of the cell. Next, the LP may be read to determine the first intermediate threshold voltage, and then a program voltage may be applied to the cell on the word line until the cell reaches a second intermediate threshold voltage corresponding to a next bit of the cell (between the LSB and the most significant bit (MSB)). Finally, the MP may be read to determine the second intermediate threshold voltage, and then a program voltage may be applied to the cell on the word line until the cell reaches the final threshold voltage corresponding to the MSB of the cell. Similarly, when reading TLCs, the controller 123 may read the LP to determine whether the LSB stores a logic 0 or 1 depending on the threshold voltage of the cell, the MP to determine whether the next bit stores a logic 0 or 1 depending on the threshold voltage of the cell, and the UP to determine whether the final bit stores a logic 0 or 1 depending on the threshold voltage of the cell.

Figure 5:
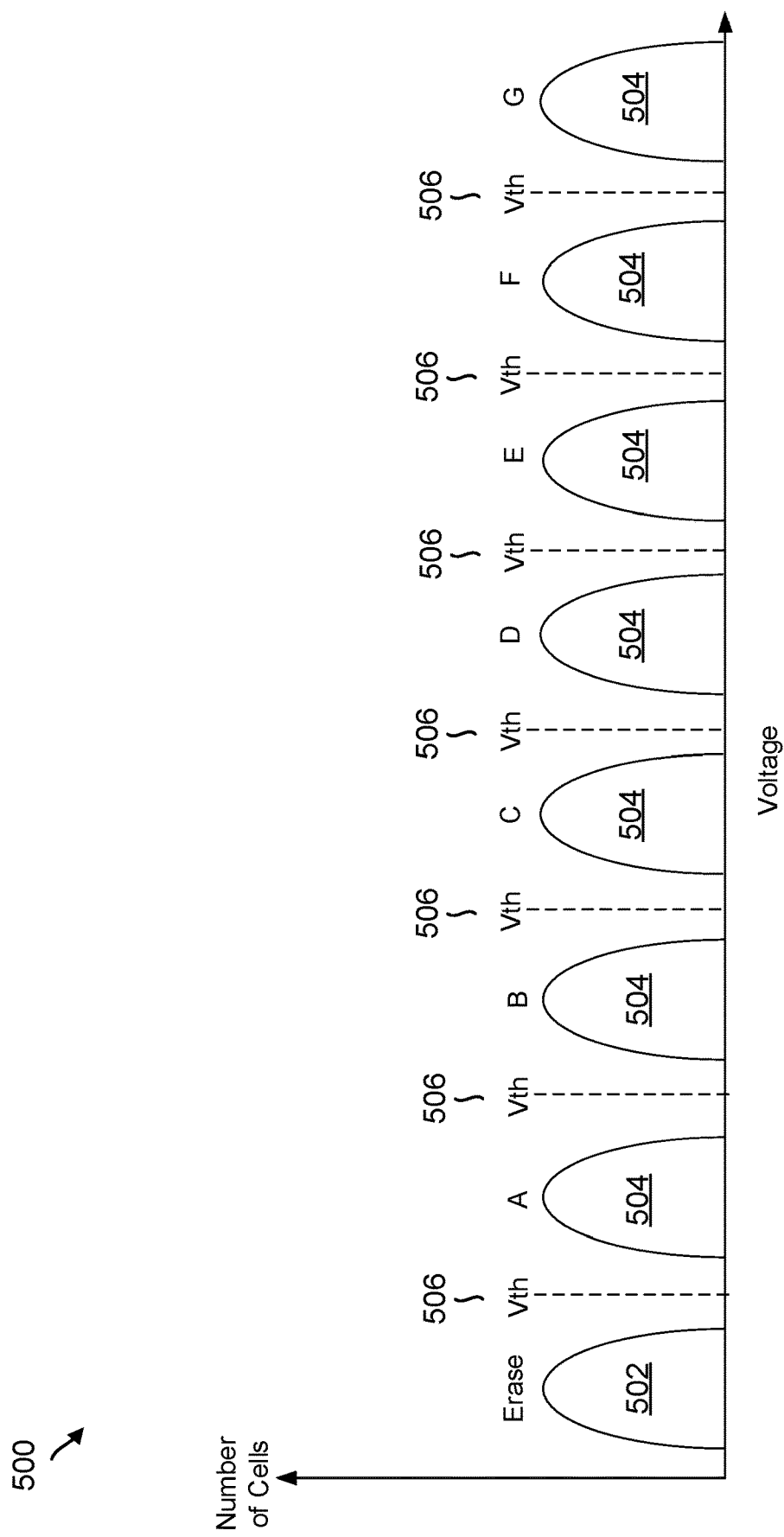
FIG. 5 is a graphical diagram illustrating an example of a voltage distribution chart for triple-level cells in the storage device of FIG. 1.

FIG. 5 illustrates an example of a voltage distribution chart 500 illustrating different NAND states for TLCs (e.g. cells 116, 302) storing three bits of data (e.g. logic 000, 001, etc. up to logic 111). The TLCs may include an erase state 502 corresponding to logic '111' and multiple program states 504 (e.g. A-G) corresponding to other logic values '000-110'. The program states 504 may be separated by different threshold voltages 506. Initially, the cells 116, 302 may be in the erase state 502, e.g. after the controller 123 erases a block 114, 402 including the cells. When the controller 123 program LPs, MPs, and UPs as described above, the voltages of the cells 116, 302 may be increased until the threshold voltages 506 corresponding to the logic values to be stored are met, at which point the cells transition to their respective program states 504. While FIG. 5 illustrates eight NAND states for TLCs, the number of states may be different depending on the amount of data that is stored in each cell 116, 302. For example, SLCs may have two states (e.g. logic 0 and logic 1), MLCs may have four states (e.g. logic 00, 01, 10, 11), and QLCs may have sixteen states (e.g. erase and A-N).

When the controller 123 attempts to program cells 116, 302 of a selected word line 304, 408 into one of the program states 504, the controller may perform incremental step pulse programming (ISPP) over a number of programming loops or ISPP cycles. For example, a programming voltage (e.g. a high voltage) may be applied to the selected word line 304, 408, a pass through voltage (e.g. a high voltage lower than the programming voltage) may be applied to the other word lines 304, 408, a bit line program voltage (e.g. a low voltage) may be applied on the bit lines 306, 406 connected to the selected cells being programmed on the selected word line, and a bit line inhibit voltage (e.g. a high voltage) may be applied on the bit lines 306, 406 connected to the other cells not being programmed on the selected word line. Applying a high programming voltage to the selected word line and a low voltage to the selected bit lines allows electrons to tunnel from the channel into the charge trapping layer of those selected cells, thereby causing the threshold voltage of the cells to increase. On the other hand, applying a high voltage to unselected bit lines inhibits electrons from tunneling from the channel into the charge trapping layer of those unselected cells, thereby preventing the threshold voltage of those cells from increasing. Thus, bit lines coupled to cells programmed to lower states may be inhibited to prevent the threshold voltage of those cells from increasing while other cells are programmed to higher states. For instance, in the case of TLCs, the bit lines of cells that are first programmed into the A state may be inhibited first, followed by the bit lines of different cells that are programmed into the B state, followed by those that reach the C state, then the D state, and so forth until the remaining cells on the selected word line ultimately reach the G state and all cells on the selected word line have been programmed.

After the programming voltage is applied in one programming loop or ISPP cycle, a program verify voltage (e.g. a low voltage) may be applied to the word line 304, 408 to determine whether the threshold voltage of a cell has increased beyond a respective threshold voltage into an intended program state. If none of the cells have transitioned into an intended programming state, then another programming loop or ISPP cycle is performed in which a higher programming voltage may be applied to further increase the threshold voltage of the cells. Subsequently, a program verify voltage may again be applied to determine whether the threshold voltage of a cell has transitioned into an intended program state. The above process of incrementally increasing the programming voltage and verifying the voltage threshold of the selected cells may be repeated over a number of programming loops. If the cells transition into their respective programming states and the total number of programming loops does not exceed a predetermined loop count, the controller may determine that the cells have entered their intended program states and are thus successfully programmed.

When the controller 123 performs a program operation in a die as described above (e.g. using ISPP), data 119 is transferred into data latches 126 and programmed into the cells 116, 302 of that die. For example, when programming a TLC, data may be stored in a number of latches (e.g. including latches corresponding to the LP, MP, and UP), transferred from the latches to the TLC via the bit line 308, 408, and then programmed using applied voltages on the word line 304, 408 and bit line until the TLC transitions into a respective program state (e.g. A-G). Similarly, when programming a QLC, data may be stored in a number of latches, transferred to the QLC via the bit line, and programmed using applied voltages on the word line and bit line until the QLC transitions into a respective program state (e.g. A-N).

While the data latches 126 are occupied with data for programming, the die may be in a cache busy state. When one of the latches later becomes free (e.g. after programming), the die may enter a cache release state. A cache release may initiate a suspend resume window, during which the controller 123 may suspend the program operation, perform another operation such as a SLC read using the free latch, and then resume the program operation after completing the other operation. For instance, FIG. 6A illustrates an example 600 of a QLC program operation 602 spanning a total programming time 604, during which the die is cache busy for a portion 606 of the time 604 (e.g. 15%), and during which the controller may perform suspend resume operations within a suspend resume window 608 for a remainder of the time 604 following a cache release 610. During the suspend resume window 608, the controller may incur controller overheads associated with performing the SLC read (or other operation) in the background while the programming or SLC read is being performed in the foreground. In other words, the controller may hide the controller overheads in the suspend resume window 608.

However, when the number of data latches 126 is reduced to save design costs for the storage device 102, the amount of time that the die may be in cache busy state may be increased (since the time to free one of the data latches after programming may be longer when fewer data latches exist). Therefore, the time before a cache release occurs may be lengthened, resulting in a smaller suspend resume window during the program operation. For instance, FIG. 6B illustrates an example 650 of a QLC program operation 652 spanning a total programming time 654, during which the die is cache busy for a portion 656 of the time 654 (e.g. 77%), and during which the controller may perform suspend resume operations within a suspend resume window 658 for a remainder of the time 654 following a cache release 660. Unlike the example of FIG. 6A, in this example 650, the number of data latches 126 in the storage device 102 may be reduced (e.g. from 4 latches to 3 latches), thus increasing the cache busy time (i.e. portion 656) from 15% to 77% and resulting in a smaller suspend resume window. With such smaller window, less controller overheads associated with performing SLC reads or other operations may be hidden in the background, resulting in reduced performance.

To achieve maximum performance, dies may be operated in parallel. For example, when the controller 123 sends a command to multiple dies to program or read the cells 116, 302 in NAND memory, the total NAND execution time of all dies may be equal to the NAND execution time of one of the dies when the dies are all operating in parallel. However, as the controller 123 sends commands to the dies serially (e.g. one at a time), the amount of time for the controller to issue the program or read command to each die (e.g. the firmware or controller overhead) may be multiplied by the number of dies. Thus, even if dies operate in parallel, multiple controller overheads (one for each die) may be incurred.

Figure 7:
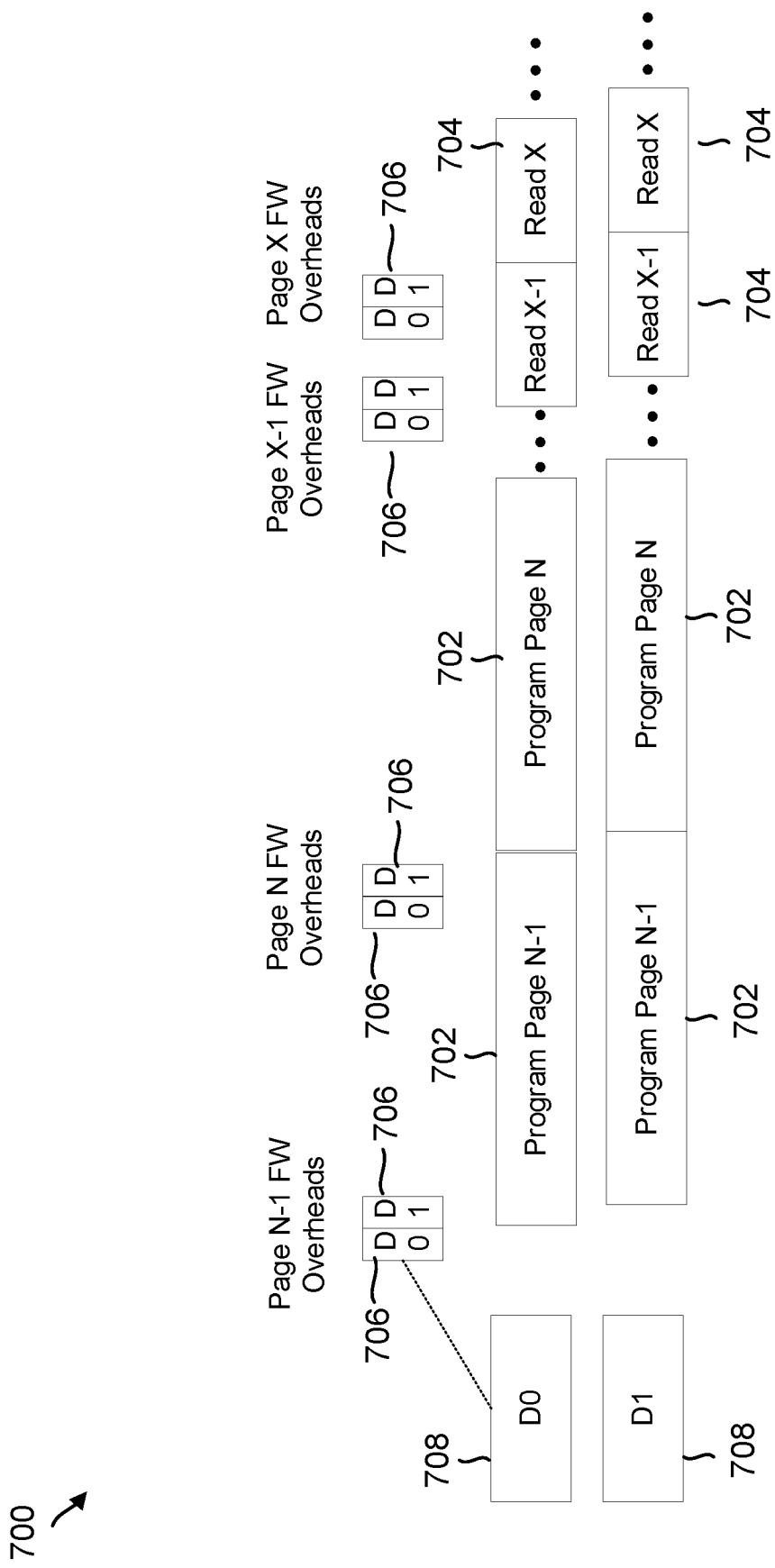
FIG. 7 is a conceptual diagram illustrating an example of program and read operations performed for a small number of dies.

When the number of dies performing a current NAND operation is small, the controller overheads for a subsequent NAND operation may be hidden behind (i.e. performed in the background during) the current NAND operation. For example, while a current page is being read by multiple dies in the foreground, the controller 123 may in the background issue commands to the dies to read a subsequent page. FIG. 7 illustrates an example 700 of program operations 702 and read operations 704 performed for a small number of dies (e.g. two dies D0 and D1) where a controller overhead 706 for each die 708 that is associated with a subsequent page read may be hidden behind a current page read.

In this example 700, the controller 123 may receive a command from the host device 104 to program N pages of data across multiple dies in parallel. For instance, the controller may program a metapage (e.g. multiple pages 316 of cells 116, 302 across dies 708) within a metablock (e.g. a group of blocks 402 between different dies 708) of a metadie (e.g. a group of dies 708). In response to the host command, the controller may incur controller overhead 706 associated with page N-1 for dies 0 and 1. For example, the controller may issue a command to die 0 to program some cells in page N-1, followed by a command to die 1 to program other cells in page N-1. The dies 708 may then program the cells of the page N-1 in parallel in response to the commands. In the meanwhile, while page N-1 is being programmed in the foreground, the controller may in the background incur controller overhead 706 associated with page N for dies 0 and 1. For example, the controller may issue a command to die 0 to program some cells in next page N, followed by a command to die 1 to program other cells in next page N, while page N-1 is still being programmed. When page N-1 has completed programming, the dies 708 may then program the cells of the page N in parallel. This process may repeat for subsequent pages until all of the program operations 702 are completed.

After completing the program operations 702, the controller 123 may read X pages of data 119 in parallel across the dies 708. For instance, the controller may read multiple pages 316 of cells 116, 302 within the metapage/block/die to verify whether programming is successful. Accordingly, the controller may incur controller overhead 706 associated with page X-1 for dies 0 and 1. For example, the controller may issue a command to die 0 to read some cells in page X-1, followed by a command to die 1 to read other cells in page X-1. The dies 708 may then sense the cells of the page X-1 in parallel in response to the commands. In the meanwhile, while page X-1 is being sensed in the foreground, the controller may in the background incur controller overhead 706 associated with next page X for dies 0 and 1. For example, the controller may issue a command to die 0 to read some cells in next page X, followed by a command to die 1 to read other cells in next page X, while page X-1 is still being sensed. When page X-1 has completed sensing, the controller overheads 706 for the dies associated with page X may have all been incurred (due to there being few dies), and the dies 708 may then proceed to sense the cells of the page X in parallel. This process may repeat for subsequent pages until all of the read operations 704 are completed.

In the example 700 of FIG. 7, the controller overheads 706 associated with reading page X may be hidden behind the read operation 704 for page X-1 since the number of dies is small (e.g. 2). However, when the number of dies is large, the controller overheads for all of the dies may be too large to all hide behind the read operation for page X-1. In such case, the remaining controller overheads that occur after the read operation for page X-1 is complete may be processed in the foreground, causing a bottleneck which delays execution of the read operation for page X and reduces storage device performance. FIG. 8 illustrates an example 800 of program operations 802 and read operations 804 performed for a large number of dies (e.g. 32 dies D0 -D31) where a controller overhead 806 for each die 808 that is associated with a subsequent page read may not all be hidden behind a current page read.

In this example 800, the controller 123 may receive a command from the host device 104 to program N pages of data across multiple dies in parallel, similar to the example 700 of FIG. 7. After completing the program operations 802, the controller 123 may read X pages of data 119 in parallel across dies 808, also similar to the example 700 of FIG. 7. Accordingly, while page X-1 is being sensed in the foreground, the controller may in the background incur controller overhead 806 associated with page X for dies 0-31. For example, the controller may issue a command to die 0 to read some cells in next page X, followed by a command to die 1 to read other cells in next page X, followed by a command to die 2 to read further cells in next page X, and so forth while page X-1 is still being sensed.

However, unlike the example 700 of FIG. 7 with a smaller number of dies, when page X-1 has completed sensing in the example 800 of FIG. 8, the controller overheads 806 for all of the dies 808 associated with page X may not have all been incurred. For example, as illustrated in FIG. 8, the amount of time 810 to perform each read operation 804 may be insufficient to hide the controller overheads 806 for all of the dies 808. For instance, assuming in one example the amount of time 810 to complete the read operation 804 for page X-1 is 50 µs, and assuming that the controller overhead 806 for each die is 10 µs, only five of the dies (e.g. D0-D4) may be successfully hidden behind the read operation 804. As a result, the controller overheads 806 for the remainder of the dies (e.g. D5-D31) may take place in the foreground, resulting in a bottleneck which delays the sensing of page X until all of the controller overheads 806 have been incurred. Such latency due to the increased number of dies may even be more severe for lower cost storage devices with limited CPU processing power, which may lengthen each of the controller overheads 806 and thus result in even longer bottlenecks.

When MLC operations are performed, the controller CPU(s) (e.g. firmware), DMA, low density parity check (LDPC), and other system components of the storage device 102 may be idle. Moreover, MLC operations such as TLC or QLC program operations may typically be followed by sense operations. Examples of sense operations may include Enhanced Post Write Read (EPWR), header verification, and other SLC reads (e.g. host reads, relocation reads, control information/L2P reads, etc.). For instance, in EPWR, after each program operation, the controller 123 may sense the data 119 that is programmed to verify whether programming is successful. Similarly in header verification, after programming data 119 in SLCs, the controller 123 may fold the data from the SLCs to MLCs along with header data that is read/verified after folding for use in subsequent updating of the L2P mapping table 120, 205.

Typically, after the controller 123 triggers MLC program operations on all dies together (e.g. the blocks are grouped in a meta-block across the dies), the controller performs other operations (e.g. EPWR, header verification, other SLC reads, etc.) when the system components of the storage device are no longer idle. However, similar to the example 800 of FIG. 8, when sense operations such as in EPWR are issued after programming a meta-block across a large number of dies, the controller overheads may not be successfully hidden behind the sense operation time, thus resulting in bottlenecks and possibly starving the dies from use. FIG. 9 illustrates an example 900 of program operations 902 and SLC read operations 904 (e.g. in EPWR or other SLC operations) performed for a large number of dies (e.g. 32 dies D0-D31), in which case a controller overhead 906 for each die 908 that is associated with a subsequent SLC operation may not all be hidden behind a current SLC operation.

In this example 900, the controller 123 may receive a command from the host device 104 to program N pages of data across multiple dies in parallel, similar to the example 800 of FIG. 8. After completing the program operations 902, the controller 123 may perform the SLC read operations 904 in parallel across dies 908, also similar to the example 800 of FIG. 8. However, the amount of time to perform each SLC read operation 904 may be less than the controller overheads 906 associated with all of the dies 908. For instance, assuming in one example the amount of time to complete the SLC read operation 904 is 110 µs, and assuming that the controller overhead 906 for each die is 10 µs, then eleven of the dies (e.g. D0-D10) may be successfully hidden behind the SLC read operation 904. Accordingly, the controller overheads 906 for the remaining twenty-one dies (e.g. D11-D31) may take place in the foreground, resulting in a bottleneck which causes at least some of the dies to be idle for a period of time 910 until all of the controller overheads 906 have been incurred (e.g. 210 μs in this example). The performance of the storage device may thus be significantly decreased.

To address such bottlenecks, the controller 123 may perform program operations 602, 652, 702, 802, 902 (e.g. of MLCs, TLCs, QLCs, PLCs, etc.) asymmetrically across dies 708, 808, 908. For example, instead of initially programming all dies at the same time (e.g. in a meta-page across blocks of different dies) such as described above with respect to FIGS. 7-9, the controller may refrain from performing a program operation for a die or group of dies (e.g. of a metadie) based on controller overheads 706, 806, 906 to be incurred. During the time that the controller refrains from programming such die or group of dies, the controller may perform CPU-intensive or other common resource intensive operations, thereby keeping the die or group of dies busy while the other dies are completing their program operations. The asymmetry may be created such that it does not collide with the suspend resume window 608, 658 across dies. For instance, the controller may incur the controller overheads 706, 806, 906 and hide them behind CPU or other common resource intensive operations during the cache busy time (e.g. portion 606, 656), after which the controller may suspend and resume a program operation during the suspend resume window as previously described.

Accordingly, even when all dies have a pending MLC program operation, the controller 123 may intentionally withhold the program operation for one or more dies, and in the meanwhile perform other operation(s) on the one or more dies, to prevent controller overhead bottlenecks from occurring as described above. Such approach may be advantageous over other approaches which merely focus on maximizing die utilization, e.g. where one of the dies does not have a pending QLC program operation and so the controller performs another operation on the unutilized die. Moreover, the controller may consider the operations performed on all of the dies (e.g. the total controller overheads which may be occurred in all dies) as part of its determination whether to withhold program operation(s) for one or more dies and thereby prevent CPU or common-resource intensive operations from occurring simultaneously on all dies. Such approach may be advantageous over other approaches that consider dies independently with respect to each other and merely issue a pending operation to a die if the die is free, in which case controller overhead bottlenecks may still occur. As a result, the storage device 102 may remove bottlenecks that may be caused by multiple dies attempting CPU or common resource intensive operations at the same time. Such advantage may reduce latency and provide a significant boost in performance, as opposed to, for example, simply freeing SLC space on one or more dies while QLC program operations are occurring on other dies.

FIG. 10 illustrates an example 1000 of program operations 1002 and common-resource intensive operations 1004 (e.g. CPU-intensive operations such as SLC read operations) performed for a large number of dies (e.g. 32 dies D0-D1). In this example 1000, the controller may asymmetrically perform program operations 1002 such that controller overheads 1006 associated with the common-resource intensive operations 1004 for each die 1008 may be hidden behind existing operations. For example, when the controller 123 receives a command from the host device 104 to program N pages of data in QLCs across multiple dies in parallel, the controller may select one of the dies 1008 to refrain or delay from programming a particular page, and issue a command to the die to perform an SLC operation (e.g. as part of controller overhead 1006) while the other dies 1008 are programming their respective QLCs in the page (e.g. a meta-page including cells in all of the dies). Although not shown in FIG. 10 for clarity, it should be noted that controller overheads may similarly be incurred when the controller issues commands to the other dies to program their respective QLCs in the page. After the SLC operation is performed, the controller may instruct the selected die to proceed with programming the QLCs of that page. When the page is completely programmed (e.g. in the dies other than the selected die), the controller may select a different die 1008 to similarly refrain from programming while the other dies are programming a different page. The controller may select which dies to refrain from programming each respective page according to a rotation order (e.g. D30, followed by D31, followed by D0, followed by D1, etc.), or arbitrarily in other examples. The controller may continue to operate accordingly until all N pages have been programmed. Such asymmetric operation handling may allow for balancing of common-resource intensive operations 1004, thus preventing bottlenecks due to associated controller overheads 1006 from occurring.

For instance, referring to the example 1000 of FIG. 10, assume that the controller 123 receives a command from the host device 104 to program N pages of data and that the cells of pages 0-N-3 have all been programmed currently. Thus, the controller may issue commands to most of the dies 1008 to program page N-2 next. However, rather than issuing the same command to die 1 at this time, the controller may refrain from programming page N-2 in die 1 and instead issue a command to die 1 to perform a SLC read operation (e.g. as referenced by controller overhead 1006 for D1). Thus, die 1 may subsequently perform the SLC read operation while the other dies 0 and 2 -31 are programming page N-2. Once the die 1 has completed the SLC read operation, the controller may then issue the command to die 1 to program page N-2, and the die 1 may proceed accordingly. As a result, the controller overhead 1006 associated with the SLC read operation is small enough (i.e. there is just one overhead for D1) to hide behind a previous program operation (e.g. for programming page N-3), and thus no bottleneck may occur that may cause delay in programming next page N-2.

Next, the controller 123 may issue commands to most of the dies 1008 to program page N-1, including die 1. However, in this case, the controller may select a different die to refrain from programming page N-1 (i.e. die 30), and instead issue a command to that die to perform a SLC read operation at this time (e.g. as referenced by controller overhead 1006 for D30). Accordingly, the die 30 may perform the SLC read operation while the other dies 0-29 and 31 are programming page N-1 (or N-2). Once the die 30 has completed the SLC read operation, the controller may issue the command to die 30 to program page N-1, and the die 30 may proceed accordingly. As a result, the controller overhead 1006 associated with the SLC read operation is small enough (i.e. there is just one overhead for D30) to hide behind the program operation for page N-2, and thus no bottleneck may occur that may delay programming next page N-1. A similar benefit may occur when the controller subsequently selects another die (e.g. die 31) to perform an SLC read operation while other dies are programming the next page (e.g. page N), and the process may repeat with different dies until all the pages have been successfully programmed.

While the example 1000 of FIG. 10 illustrates a single controller overhead 1006 (e.g. for one SLC operation of one die) hidden behind each program operation 1002, multiple controller overheads (e.g. for multiple SLC operations of one die or one SLC operation for multiple dies) may similarly be hidden behind each program operation. For example, the controller may select more than one die at a time to refrain from programming a particular page. The number of dies that may be selected may be based on a time 1010 for completing the common resource intensive operation 1004, and the amount of time of each controller overhead 1006. As an example, assume the storage device 102 includes 32 dies, that the common resource intensive operation 1004 is a SLC read operation, that the time 1010 to perform the SLC read operation (to sense data in one of the dies) is 50 μs, and that the controller overhead 1006 associated with performing the SLC read operation (the time to issue the command to the die to sense the data) is 10 μs. In such case, the controller may select five dies (10 μs*5=50 μs) to refrain from page programming and instead to perform SLC operations, since the controller overhead 1006 for all five dies may be successfully hidden behind the time 1010 for completing a single SLC operation. Thus, the remaining 27 dies may perform their respective QLC operations with respect to a particular page while the selected 5 dies are performing their respective SLC operations (or other CPU-intensive operations). Similarly, for the next page, the controller may select another five dies (different than the previous five) to refrain from page programming and to perform SLC reading accordingly, and the controller may repeat the process for subsequent pages by rotating between different dies until all the pages have been fully programmed.

In the example 1000 described above, the common-resource intensive operation 1004 may be a CPU-intensive operation such as a sense operation. Sense operations may include, for example, MLC reads during EPWR, header reads (for header verification), other internal reads (e.g. relocation reads, read scrub operations, etc.), or host reads. Such sense operations may include a relatively low ratio of controller overhead 1006 to operation time 1010 (e.g. ⅕ or 10 μs/50 μs). However, in other examples, the CPU-intensive operation may be a write operation that is performed in lower cost controllers, which may include a relatively higher ratio of controller overhead 1006 to operation time 1010 (e.g. due to longer controller overheads from less CPU speed). For instance, assume the storage device 102 includes 16 dies, that the common resource intensive operation 1004 is a SLC write operation, that the time 1010 to perform the SLC write operation (to program data in SLCs of one of the dies) is 140 μs, and that the controller overhead 1006 associated with performing the SLC write operation (the time to issue the command to the die to program the data) is 30 μs (due to less CPU speed). In such case, the controller may select four dies (140 μs/30 μs~4) to refrain from page programming and instead to perform the SLC write operation, since the controller overhead 1006 for all four dies may be successfully hidden behind the time 1010 for completing the single SLC operation. Thus, assuming that there is pending work for all sixteen dies such as a QLC program operation, the remaining 12 dies may perform their respective QLC operations with respect to a particular page while the selected 4 dies are performing their respective SLC write operations. Similarly, for the next page, the controller may select another four dies (different than the previous four) to refrain from page programming and to perform SLC writing accordingly, and the controller may repeat the process for subsequent pages by rotating between different dies until all the pages have been fully programmed.

Furthermore, while the example 1000 described above refers to the common-resource intensive operation 1004 as a CPU-intensive operation (i.e. the operation 1004 involves limited processing power as a common resource shared across dies), the common resource may not be so limited. For example, the common-resource intensive operation 1004 may be another operation that involves common resources shared across multiple dies, such as buffer(s) (e.g. buffer 121) or controller RAM (e.g. volatile memory 118). In one example, when the controller performs data relocation, data may be read from the QLCs into the buffer(s) of controller RAM and then written from the buffer(s) into different QLCs. If relocation is to be performed for multiple dies in parallel, then the buffer(s) may not be large enough to store all of the data to be relocated for all of the dies. Accordingly, instead of performing a relocation operation at the same time for all of the dies, the controller may asymmetrically perform the relocation operations such that the buffer transfers are limited to a number of dies based on the buffer size. For instance, if the buffer size is 128 KB and each relocation operation requires 128 KB of QLC data (or other amount enough for one die), then the controller may select one die at a time for the data relocation and refrain from relocating the data in other dies in the meanwhile. In another example, when the controller attempts to transfer data (e.g. using DMA) from the controller RAM to the data latches 126, or vice-versa, in a large number of dies prior to performing program operation in each die, the delay in waiting for the transfer to complete for all dies may cause a similar bottleneck. Accordingly, instead of performing the DMA operation at the same time for all of the dies, the controller may asymmetrically perform the DMA operations such that the DMA transfers are limited to a number of dies.

Figure 11:
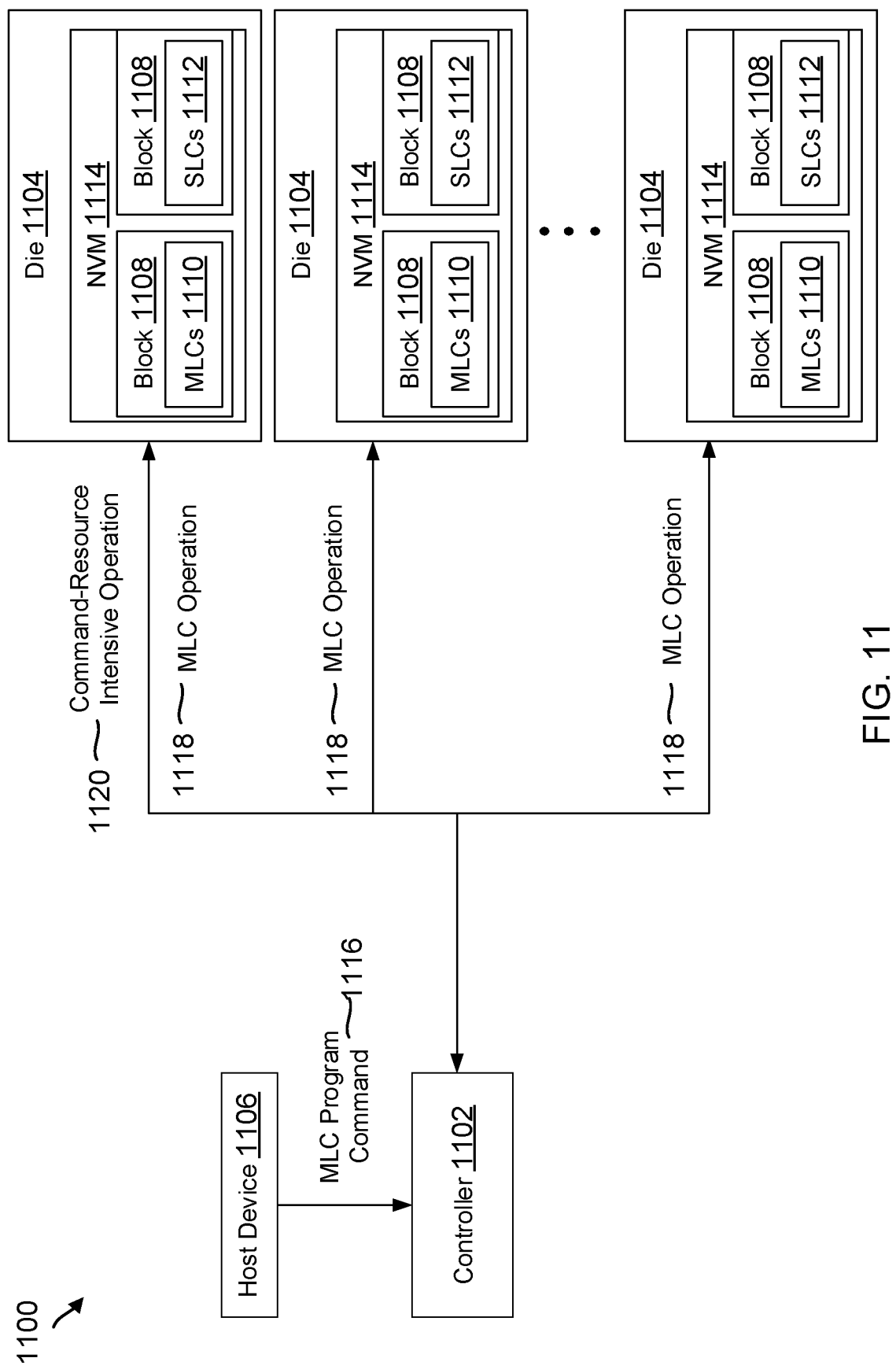
FIG. 11 is a conceptual diagram illustrating an example of a controller that communicates with multiple dies to asymmetrically perform operations in the storage device of FIG. 1.

FIG. 11 illustrates an example 1100 of a controller 1102 in communication with multiple dies 1104 and with a host device 1106. Each die 1104 may include blocks 1108 of MLCs 1110 and SLCs 1112. The controller 1102 may correspond to controller 123 of FIG. 1, and each die 1104 may include a NVM 1114 corresponding to the NVM 110 of FIG. 1. The NVM 1114 may include the blocks 1108 of the MLCs 1110 and SLCs 1112, which may respectively correspond to the blocks 402 and the cells 116, 302 of FIGS. 1, 3 and 4. The host device 1106 may correspond to host device 104 of FIG. 1.

The controller 1102 may receive a MLC program command 1116 from the host device 1106 to program one or more pages of the MLCs 1110 in the blocks 1108 of the dies 1104. For instance, the dies 1104 may be grouped into a meta-die, and the MLC program command may include a logical address corresponding to a meta-block (e.g. a group of the blocks 1108 across the dies 1104) along with the data to be programmed into the MLCs 1110 (e.g. in one or more meta-pages or groups of pages of MLCs 1110 across the dies). In response to the MLC program command 1116, the controller 1102 may perform an MLC operation 1118 in most of the dies 1104. For example, the MLC operation 1118 may correspond to program operation 1002 in FIG. 10. For instance, the controller may translate the logical address received in the MLC program command 1116 to physical addresses associated with the blocks 1108, and issue commands including the physical addresses and the data to most of the dies to perform the MLC operation 1118. For instance, the controller may translate the logical address received in the MLC program command 1116 to physical addresses associated with the blocks 1108, and issue commands including the physical addresses and the data to most of the dies to perform the MLC operation 1118. The dies 1104 which receive the commands may then proceed to program the MLCs 1110 in parallel.

However, the controller may select one or more of the dies 1104 to refrain from performing the MLC operation 1118, and instead may perform a common resource intensive operation 1120 in the selected die. The common resource intensive operation 1120 may correspond to common resource intensive operation 1004 in FIG. 10, and may include an SLC operation that uses the limited processing power of the controller CPU (e.g. an SLC read operation that may be performed in EPWR, header verification, etc., or an SLC write operation), another MLC operation that uses a buffer or RAM of the controller (e.g. a relocation operation from one block of MLCs to another block of MLCs using the buffer 121 or volatile memory 118), or a transfer operation (e.g. DMA) that also uses the volatile memory of the controller. For instance, the controller may intentionally delay programming the MLCs 1110 in the block 1108 of a selected die, and instead issue a command to that die to read data from its SLCs 1112 while the other dies 1104 are programming their MLCs 1110. The number of dies which the controller may select to withhold programming and perform the common resource intensive operation 1120 may be based on the length of the common resource intensive operation and the controller overhead associated with performing the common resource intensive operation 1120 (e.g. the time required to issue the command(s) to read the SLCs 1112 in those dies). For instance, if the common resource intensive operation is an SLC read operation that spans 50 μs and the amount of time to set up and issue the command to each die is 10 μs, the controller may select to withhold programming in five of the dies 1104 and proceed to perform common resource intensive operations in those five dies while the other dies are performing the MLC operations 1118.

After the selected die(s) 1104 complete performance of the common resource intensive operation(s) 1120, the controller may proceed to perform the MLC operation 1118 in those die(s). For instance, after a selected die completes reading SLCs 1112 in response to an SLC read operation, the controller may then issue a command to the selected die to program the MLCs 1110 in response to the MLC program command 1116. The controller may similarly repeat the above process for other dies until the MLC program command 1116 has been completely processed. For instance, if the controller is to program multiple pages of data in response to the MLC program command, the controller may select for each page a different group of dies 1104 to withhold programming and instead perform common resource intensive operations in those selected dies during that time. Thus, the controller overhead(s) associated with issuing the common resource intensive operation(s) 1120 may be hidden behind foreground operations, thereby preventing bottlenecks from occurring which delay execution of subsequent MLC operations 1118.

Figure 12:
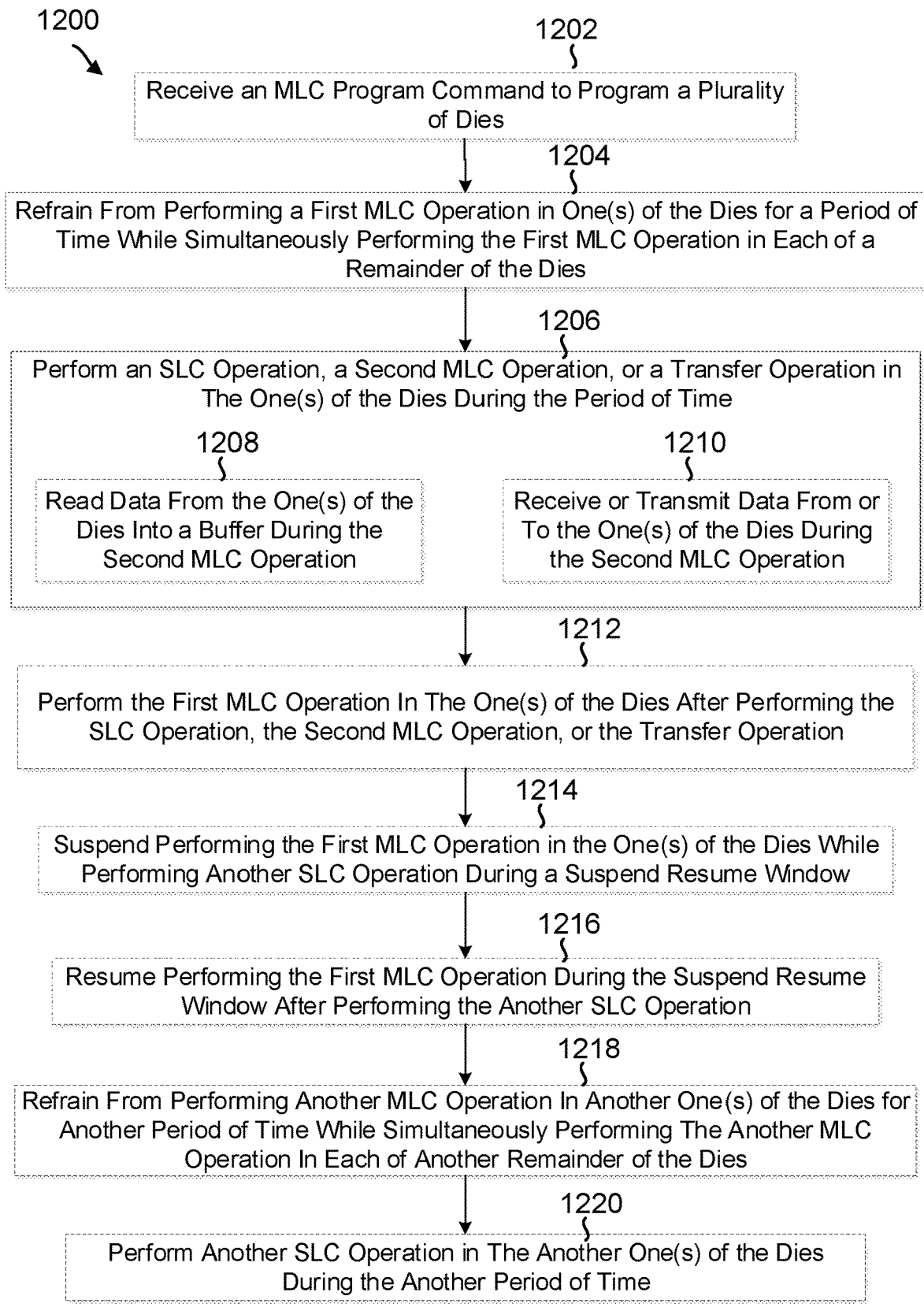
FIG. 12 is a flow chart illustrating a method for asymmetrically performing operations in dies by the storage device of FIG. 1.

FIG. 12 illustrates an example flow chart 1200 of a method for asymmetrically performing operations in dies. For example, the method can be carried out in a storage device 102 such as the one illustrated in FIG. 1. Each of the steps in the flow chart can be controlled using the controller as described below (e.g. controller 123, 1102), or by some other suitable means. Optional aspects are illustrated in dashed lines.

As represented by block 1202, the controller may receive an MLC program command to program a plurality of dies. The plurality of dies may each include a plurality of MLCs and a plurality of SLCs. For example, referring to FIG. 11, the controller 1102 may receive the MLC program command 1116 from the host device 1106 to program multiple dies 1104. Each of the dies 1104 may include MLCs 1110 and SLCs 1112.

As represented by block 1204, the controller may refrain from performing a first MLC operation in one or more of the dies for a period of time while simultaneously performing the first MLC operation in each of a remainder of the dies. For instance, referring to FIGS. 10 and 11, the controller 1102 may refrain from performing the MLC operation 1118 (e.g. programming data in the MLCs 1110) of one of the dies 1008, 1104 for a period of time 1010 while simultaneously programming one or more of the MLCs 1110 in each of the remainder of the dies 1008, 1104. For example, as illustrated in FIG. 10, the controller may select to refrain from performing the program operation 1002 for page N−2 in die 1 while the controller simultaneously performs program operations 1002 for page N−2 in the remaining dies 0 and 2-31. The MLCs 1110 may each comprise one of a TLC, a QLC, or a PLC (e.g. cells 116, 302).

As represented by block 1206, the controller may perform an SLC operation, a second MLC operation, or a transfer operation in the one or more of the dies during the period of time. In one example, the SLC operation may comprise one of a read operation or a write operation. For instance, referring to FIGS. 10 and 11, the controller 1102 may perform a common resource intensive operation 1004, 1120 (e.g. a SLC read operation, a SLC write operation, another MLC operation such as data relocation, or a transfer operation such as DMA) in one or more of the dies 1008, 1104 during the period of time 1010. In one example, the controller may read data from SLCs 1112 in die 1 during the period of time 1010 while the remaining dies 0 and 2-31 are programming data in the MLCs 1110 for page N−2.

In another example, as represented by block 1208, the controller may include a volatile memory having a buffer, and the controller may read data from the one or more of the dies into the buffer during the second MLC operation. For instance, referring to FIGS. 1, 10, and 11, the controller 123, 1102 may include a volatile memory 118 having a buffer 121, and the controller may relocate data from one block 1108 of MLCs 1110 to another block 1108 of MLCs 1110 in the selected die 1 during the period of time 1010 (e.g. by reading data into the buffer 121 from the former block and writing data from the buffer into the latter block) while the remaining dies 0 and 2-31 are performing other operations (e.g. program operations 1002).

In another example, as represented by block 1210, the controller may receive or transmit data from or to the one or more dies during the second MLC operation. For instance, referring to FIGS. 1, 10, and 11, the controller 123, 1102 may include a volatile memory 118, and the controller may receive data from the MLCs 1110 of the selected die 1 into the volatile memory 118 (e.g. using DMA from NAND to controller), or may transmit data from the volatile memory 118 to the MLCs 1110 of the selected die 1 (e.g. using DMA from controller to NAND), during the period of time 1010 while the remaining dies 0 and 2-31 are performing other operations (e.g. program operations 1002).

As represented by block 1212, the controller may perform the first MLC operation in the one or more dies after performing the SLC operation, the second MLC operation, or the transfer operation. For example, referring to FIGS. 10 and 11, the controller 1102 may perform the MLC operation 1118 (e.g. program the data in response to the MLC program command 1116) in one or more of the MLCs 1110 of the one of the dies 1104 after performing the common resource intensive operation 1004, 1120. For example, as illustrated in FIG. 10, the controller may proceed to program page N−2 in the MLCs of selected die 1 after reading the SLCs during the period of time 1010.

As represented by block 1214, the controller may suspend performing the first MLC operation in the one or more dies while performing another SLC operation during a suspend resume window. Then, as represented by block 1216, the controller may resume performing the first MLC operation during the suspend resume window after performing the another SLC operation. For instance, referring to FIGS. 6, 10 and 11, the MLC operation 1118 (e.g. program operation 602, 1002) may include a suspend resume window 608, and the controller 1102 may suspend programming the data in the one or more of the MLCs 1110 of the one of the dies 1104 while performing another common resource intensive operation 1004, 1120 during the suspend resume window 608. The controller 1102 may then resume performing the MLC operation 1118 (e.g. programming of the data) during the suspend resume window 608 after performing the common resource intensive operation 1004, 1120. For example, when the controller 1102 is programming page N−2 in die 1 after reading the SLCs during the period of time 1010, the controller may suspend programming of page N−2 to again read SLCs or complete another common resource intensive operation and then afterwards resume the programming of page N−2 during the suspend resume window 608.

As represented by block 1218, the controller may refrain from performing another MLC operation in another one or more of the dies for another period of time while simultaneously performing the another MLC operation in each of another remainder of the dies. For example, referring to FIGS. 10 and 11, the controller 1102 may refrain from performing another MLC operation 1118 in another one of the dies 1104 (e.g. programming data in the MLCs 1110 of another selected die within another program operation 1002) for another period of time 1010 while simultaneously programming one or more of the MLCs 1110 in each of another remainder of the dies 1104. For example, as illustrated in FIG. 10, after programming page N−2 in some of the dies 1008, the controller may select to refrain from performing the program operation 1002 for next page N−1 in die 30 while the controller simultaneously performs other program operations 1002 in the remaining dies 0-29 and 31. Thus, the controller may repeat the process described above (e.g. with respect to block 1204) for different dies when handling different program operations in response to the same (or different) MLC program command 1116.

As represented by block 1220, the controller may perform another SLC operation in the another one or more of the dies during the another period of time. For instance, referring to FIGS. 10 and 11, the controller 1102 may perform another common resource intensive operation 1004, 1120 (e.g. another SLC read operation, another SLC write operation, another MLC operation such as another data relocation, or another transfer operation such as DMA) in another of the one or more of the dies 1008, 1104 during another period of time 1010. In one example, the controller may read data from SLCs 1112 in die 30 while the remaining dies 0-29 and 31 are programming data in the MLCs 1110 for page N−1. Thus, the controller may repeat the process described above (e.g. with respect to block 1206) for different dies.

In another example, the controller may refrain from performing additional MLC operations in additional ones of the dies for another period of time while simultaneously performing the additional MLC operations in one or more of the MLCs in each of another remainder of the dies. For example, referring to FIGS. 10 and 11, the controller 1102 may refrain from programming the data in the MLCs 1110 of additional ones of the dies 1008, 1104 for the another period of time 1010 while simultaneously programming one or more of the MLCs 1110 in each of the another remainder of the dies 1104, and the controller may perform other common resource intensive operations 1004, 1120 (e.g. SLC read operations, etc.) in the additional ones of the dies 1104 during the another period of time 1010. A number of the additional ones of the dies 1008, 1104 may be based on a length of the another period of time 1010 and a controller overhead 1006 associated with performing the other common resource intensive operations 1004, 1120. For instance, referring to the illustrated example of FIG. 10, depending on the amount of time 1010 required to complete an SLC read and the amount of time to issue the SLC read command to each die (e.g. the controller overhead 1006), the controller may refrain from performing multiple program operations 1002 in multiple dies during this time 1010 and instead simultaneously perform multiple SLC reads (one for each die) at this time. For example, if the time 1010 to perform the SLC read is 50 μs and the controller overhead 1006 for each die is 10 μs, then five controller overheads may be successfully hidden behind foreground operations. Accordingly, the controller may refrain from programming page N−2 in five dies (e.g. D0-D4) and instead simultaneously read SLCs in those five dies while the other twenty seven remaining dies (e.g. D5-D31) are busy programming page N−2. The controller may similarly select another five dies (e.g. D5-D9) to refrain from programming page N−1 and instead simultaneously read SLCs in those five dies while another twenty seven different remaining dies (e.g. D0 -D4 and D10-D31) are busy programming page N−1, and so forth for each page. The process may repeat until all pages have been programmed in response to the MLC program command 1116.

As a result of asymmetric die handling of common-resource intensive operations as described above, bottlenecks may be removed and performance of the storage device may thereby be improved. For example, assume the common-resource intensive operation is an SLC read operation (e.g. in EPWR). Then for TLCs, assuming a total TLC program time of 691.2 ms for all dies, a controller overhead of 6 μs for each SLC operation, a total number of sense operations of 1152 per die, and an average sense time per die of 70 μs, the performance gain of the storage device 102 that may be achieved through asymmetric TLC operation handling may be 3.9% for 16 dies and 22% for 32 dies. Similarly for QLCs, assuming a total QLC program time of 3456 ms for all dies, a controller overhead of 7 μs for each SLC operation, a total number of sense operations of 1536 per die, and an average sense time per die of 130 μs, the performance gain of the storage device 102 that may be achieved through asymmetric QLC operation handling may be 4.2% for 32 dies.

Accordingly, the storage device described in the present disclosure may provide sustained performance gain for the storage device without increasing controller cost, which may be especially advantageous for low cost controllers. Background operations involving more CPU overheads may be performed using asymmetric operation handling, resulting in improved Quality of Service (QoS). Moreover, bottlenecks may be removed not only in connection with CPU overheads, but also in connection with other shared resources such as buffers and DMA speed.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
a plurality of dies each including a plurality of multi-level cells (MLCs) and a plurality of single-level cells (SLCs); and
a controller configured to refrain from programming data in the MLCs of a number of the dies for a period of time while simultaneously programming one or more of the MLCs in each of a remainder of the dies, and to perform an SLC operation in the number of the dies during the period of time, wherein the number of the dies is based on a length of the period of time and a controller overhead associated with performing the SLC operation.

2. The storage device of claim 1, wherein the SLC operation comprises one of a read operation or a write operation.

3. The storage device of claim 1, wherein the MLCs each comprise one of a triple-level cell (TLC), a quadruple-level cell (QLC), or a penta-level cell (PLC).

4. The storage device of claim 1, wherein the controller is further configured to program the data in one or more of the MLCs of the number of the dies after performing the SLC operation.

5. The storage device of claim 4, wherein the controller is further configured to suspend programming the data in the one or more of the MLCs of the number of the dies while performing another SLC operation during a suspend resume window, and to resume the programming of the data during the suspend resume window after performing the another SLC operation.

6. The storage device of claim 1, wherein the controller is further configured to refrain from programming the data in the MLCs of another one of the dies for another period of time while simultaneously programming one or more of the MLCs in each of another remainder of the dies, and to perform another SLC operation in the another one of the dies during the another period of time.

7. The storage device of claim 1, wherein the controller is further configured to refrain from programming the data in the MLCs of additional ones of the dies for another period of time while simultaneously programming one or more of the MLCs in each of another remainder of the dies, and to perform other SLC operations in the additional ones of the dies during the another period of time.

8. A storage device, comprising:
a plurality of dies each including a plurality of multi-level cells (MLCs) and a plurality of single-level cells (SLCs); and
a controller configured to refrain from performing a first MLC operation in a number of the dies for a period of time while simultaneously performing the first MLC operation in one or more of the MLCs in each of a remainder of the dies, and to perform one of an SLC operation, a second MLC operation different than the first MLC operation, or a transfer operation in the number of the dies during the period of time, wherein the number of the dies is based on a length of the period of time and a controller overhead associated with performing the one of the SLC operation, the second MLC operation, or the transfer operation.

9. The storage device of claim 8, wherein the SLC operation comprises one of a read operation or a write operation.

10. The storage device of claim 8, wherein the controller includes a volatile memory having a buffer, and wherein the controller is configured during the second MLC operation to read data from the number of the dies into the buffer.

11. The storage device of claim 8, wherein the controller is configured during the transfer operation to receive data from the number of the dies or to transmit data to the number of the dies.

12. The storage device of claim 8, wherein the MLCs each comprise one of a triple-level cell (TLC), a quadruple-level cell (QLC), or a penta-level cell (PLC).

13. The storage device of claim 8, wherein the controller is further configured to perform the first MLC operation in the number of the dies after performing the one of the SLC operation, the second MLC operation, or the transfer operation.

14. The storage device of claim 13, wherein the controller is further configured to suspend performing the first MLC operation in the number of the dies while performing another SLC operation during a suspend resume window, and to resume performing the first MLC operation in the number of the dies during the suspend resume window after performing the another SLC operation.

15. The storage device of claim 8, wherein the controller is further configured to refrain from performing another MLC operation in another one of the dies for another period of time while simultaneously performing the another MLC operation in one or more of the MLCs in each of another remainder of the dies, and to perform another SLC operation in the another one of the dies during the another period of time.

16. The storage device of claim 8,
wherein the controller is further configured to refrain from performing additional MLC operations in additional ones of the dies for another period of time while simultaneously performing the additional MLC operations in one or more of the MLCs in each of another remainder of the dies, and to perform other SLC operations in the additional ones of the dies during the another period of time.

17. A storage device, comprising:
a plurality of dies each including a plurality of multi-level cells (MLCs) and a plurality of single-level cells (SLCs); and
a controller configured to receive an MLC program command, to refrain from programming data in the MLCs of a number of the dies for a period of time while simultaneously programming one or more of the MLCs in each of a remainder of the dies, and to perform one of an SLC operation, a different MLC operation, or a transfer operation in the number of the dies during the period of time, wherein the number of the dies is based on a length of the period of time and a controller overhead associated with performing the one of the SLC operation, the different MLC operation, or the transfer operation.

18. The storage device of claim 17, wherein the controller is further configured to program the data in one or more of the MLCs of the number of the dies after performing the one of the SLC operation, the different MLC operation, or the transfer operation in the number of the dies.

19. The storage device of claim 18, wherein the controller is further configured to suspend programming the data in the one or more of the MLCs of the number of the dies while performing another SLC operation during a suspend resume window, and to resume the programming of the data during the suspend resume window after performing the another SLC operation.

* * * * *